(12) United States Patent
Hasegawa et al.

(10) Patent No.: US 6,690,245 B2
(45) Date of Patent: Feb. 10, 2004

(54) OSCILLATION CONTROL CIRCUIT

(75) Inventors: Eiichi Hasegawa, Tokyo (JP);
Kazuhisa Oyama, Tokyo (JP);
Masahisa Kimura, Tokyo (JP)

(73) Assignee: Nippon Precision Circuits Inc., Tokyo (JP)

(*) Notice: Subject to any disclaimer, the term of this patent is extended or adjusted under 35 U.S.C. 154(b) by 0 days.

(21) Appl. No.: 09/997,709

(22) Filed: Nov. 29, 2001

(65) Prior Publication Data

US 2002/0075090 A1 Jun. 20, 2002

(30) Foreign Application Priority Data

Dec. 20, 2000 (JP) .......................................... 2000-387453

(51) Int. Cl.[7] ................................................. H03B 5/32
(52) U.S. Cl. ...................... 331/158; 331/74; 331/108 R
(58) Field of Search ....................... 331/158, 74, 108 R, 331/116 R

(56) References Cited

U.S. PATENT DOCUMENTS

| | | | | |
|---|---|---|---|---|
| 4,675,544 A | * | 6/1987 | Schrenk | 326/81 |
| 5,673,424 A | * | 9/1997 | Sawamura | 713/500 |
| 5,869,978 A | * | 2/1999 | Hong | 426/28 |
| 5,909,152 A | * | 6/1999 | Li et al. | 331/116 FE |
| 6,118,348 A | * | 9/2000 | Narahara | 331/116 FE |
| 6,320,473 B1 | * | 11/2001 | Leuschner | 331/116 FE |

* cited by examiner

*Primary Examiner*—Robert Pascal
*Assistant Examiner*—Kimberly E Glenn
(74) *Attorney, Agent, or Firm*—Jordan and Hamburg LLP

(57) ABSTRACT

An oscillation control circuit is offered which can improve the startability of an oscillator circuit operating at high frequencies and at a low power-supply voltage. When the oscillation potential of the oscillation signal is between the inversion potential (1.2 volts) of a CMOS inverter IV1 and the inversion potential (1.8 volts) of a CMOS inverter IV2, the logical output value of a CMOS Schmitt inverter SI1 is 1. The output of a CMOS inverter formed by MOS transistors T32 and T33 is shorted out via a MOS transistor T34. Its logical output value is kept at 1. When the inversion potential of the CMOS inverter IV1 or the inversion potential of the CMOS inverter IV2 is exceeded, if the input voltage to the CMOS Schmitt trigger SI1 increases above its inversion potential (1.8 volts), the logical output value assumes a value of 0. The CMOS inverter formed by the MOS transistors T12 and T13 is first set into operation. The oscillation signal is inverted, setting a circuit LA at a later stage into operation.

4 Claims, 12 Drawing Sheets

OSCILLATION CONTROL CIRCUIT

BACKGROUND OF THE INVENTION

1. Field of the Invention

The present invention relates to an oscillation control circuit.

2. Description of the Related Art

A conventional technique of an oscillation control circuit is known as disclosed, for example, in Japanese patent No. 2585147. This conventional technique is hereinafter described by referring to FIGS. 9–11. FIG. 9 is an electrical circuit diagram showing one example of the conventional technique. FIGS. 10A, 10B, and 10C are a characteristic diagram showing the input/output characteristics (transfer characteristics) of CMOS inverters of FIG. 9. FIG. 11 is a time chart illustrating the operation of FIG. 9.

A CMOS inverter IV8 has input/output characteristics (transfer characteristics) as shown in FIG. 10(A), and has its inversion potential (logical threshold voltage) set at 2.5 volts, for example. The inversion potential referred to herein is an input voltage midway between the fall start input voltage and the fall end input voltage of the input/output characteristics. Normally, it is an input voltage when the output voltage (2.5 V) is half the power-supply voltage (e.g., 5.0 V). A quartz oscillator QZ and a feedback resistor R5 are connected in parallel between the input and output of the CMOS inverter IV8. The input and output terminals are grounded via capacitors C5 and C6, respectively. The CMOS inverter IV8, quartz oscillator QZ, feedback resistor R5, and capacitors C5, C6 together form an oscillator circuit.

A CMOS inverter IV9 has input/output characteristics as shown in FIG. 10B, and has its inversion potential set at 2.0 volts, for example. The input terminal of the CMOS inverter IV9 is connected with the output terminal of the CMOS inverter IV8, while the output terminal is connected with the gate of an N-channel MOS transistor T56. The source of the N-channel MOS transistor T56 is grounded. The drain is connected with one end of a resistor R6, with one end of a capacitor C7, and with the input terminal of a CMOS inverter IV10. The other end of the resistor R6 and the other end of the capacitor C7 are connected with a power supply terminal VDD (5.0 volts). The resistor R6 has a resistance value sufficiently larger than the ON-state resistance value of the MOS transistor T56. The CMOS inverters IV9, IV10, MOS transistor T56, resistor R6, and capacitor C7 described thus far together form an operation control circuit OPC.

The gate of an N-channel MOS transistor T51 is connected with the output terminal of the CMOS inverter IV10. The gate of a P-channel MOS transistor T54 is connected with the output terminal of the CMOS inverter IV10 via a CMOS inverter IV11. The junction of the gates of the N-channel MOS transistor T52 and P-channel MOS transistor T53 is connected with the output terminal of the CMOS inverter IV8. The junction of their drains is connected with a circuit LA at a later stage. The source of the N-channel MOS transistor T52 is grounded via the source/drain of the N-channel MOS transistor T51. The source of the P-channel MOS transistor T53 is connected with the power supply terminal VDD via the source/drain of the P-channel MOS transistor T54. The CMOS inverter IV11, N-channel MOS transistors T51, T52, and P-channel MOS transistors T53, T54 described thus far together form a CMOS clocked inverter. The circuit LA at the later stage is connected with the output of this CMOS clocked inverter.

When the logical output value of the CMOS inverter IV10 is 0, the P-channel MOS transistor T55 shorts out the output from the CMOS inverter formed by the MOS transistors T52 and T53.

The operation of the electric circuit of FIG. 9 is described by referring to FIG. 11. A, B, C, D, and E of FIG. 11 correspond to points a, b, c, d, and e, respectively, of FIG. 9.

As shown in FIG. 11A, when the power supply is turned on, the CMOS inverter IV8 produces an oscillation signal of minute amplitude. Although the amplitude of this oscillation signal increases gradually, the logical output value of the CMOS inverter IV9 is kept at 0 (FIG. 11B) until the oscillation potential drops below the inversion potential (2.0 V) of the CMOS inverter IV9. Therefore, the MOS transistor T56 is driven off. The output of the CMOS inverter IV10 assumes a logical value of 0 (FIG. 11D). As a result, the MOS transistors T51 and T54 are cut off. The CMOS inverter formed by the MOS transistors T52 and T53 is deactivated. At this time, the MOS transistor T55 is ON and so the output from the CMOS inverter formed by the MOS transistors T52 and T53 is shorted out via the MOS transistor T55. In this way, the CMOS inverter formed by the MOS transistors T52 and T53 is maintained in inoperative state until the oscillation potential of the oscillation signal exceeds the inversion potential (2.0 V) of the CMOS inverter IV9. Its logical output value is kept at 1.

When the oscillation potential of the oscillation signal exceeds the inversion potential (2.0 volts) of the CMOS inverter IV9, the output from the CMOS inverter IV9 assumes a logical value of 1 (FIG. 11B), turning on the MOS transistor T56. As a result, as shown in FIG. 11C, the capacitor C7 is charged through the MOS transistor T56. The input voltage to the CMOS inverter IV10 drops rapidly. When the MOS transistor T56 is cut off, electric charge in the capacitor C7 is released via the resistor R6. The input voltage to the CMOS inverter IV10 rises mildly. When the input voltage to the CMOS inverter IV10 drops below its inversion potential, the logical output value of the CMOS inverter IV10 is inverted from 0 to 1. As a result, the CMOS inverter formed by the MOS transistors T52 and T53 is first set into operation. At the same time, the MOS transistor T55 is turned off. By setting the resistance value of the resistor R6 sufficiently greater than the ON-state resistance value of the MOS transistor T56, the logical output value of the CMOS inverter IV10 remains at 1, as shown in FIG. 11D. The oscillation signal generated by the CMOS inverter IV8 is inverted by the CMOS inverter formed by the MOS transistors T52 and T53. As shown in FIG. 11E, a clock signal having a duty cycle of 50% can be produced. This inverted output (clock signal) sets the circuit LA at the later stage into operation.

The circuit at the later stage is set into operation after the amplitude of the oscillation signal reaches a certain magnitude in this way. Consequently, the problem that the oscillation operation is made unstable by the effect of noise produced by the circuit at the later stage to thereby hinder shift from the oscillating operation with minute amplitudes to steady-state amplitude oscillating operation can be solved.

However, it has been required that the oscillator circuit use a higher frequency and consume a less amount of electric power. Therefore, smaller-sized quartz oscillators and lower power-supply voltages have been adopted. With this trend, there is a demand for a decrease in the steady-state amplitude of the oscillation signal. FIG. 12 is a time chart illustrating the operation of the electric circuit of FIG. 9 where the steady-state amplitude of the oscillation signal is suppressed in the conventional case described above. Note that A, B, C, D and E of FIG. 12 correspond to points a, b, c, d, and e, respectively, of FIG. 9.

Since the steady-state amplitude of the oscillation signal is small, the time for which the oscillation potential of the oscillation signal is in excess of the inversion potential (2.0 V) of the CMOS inverter IV9 is shortened as shown in FIG. 12A. Therefore, the time for which the output from the CMOS inverter IV9 assumes a logical value of 1 is shortened and the time for which the output assumes a logical value of 0 is prolonged as shown in FIG. 12B. Consequently, the input voltage to the CMOS inverter IV10 drops rapidly in a shorter time and rises mildly in a longer time. As a result, as shown in FIG. 12C, the input voltage to the CMOS inverter IV10 varies about its inversion potential (2.5 V). Therefore, as shown in FIG. 12D, the logical output value of the CMOS inverter IV10 once makes an inversion from 0 to 1. Immediately thereafter, an inversion from 1 to 0 is made. In this way, unstable state occurs. The oscillation signal produced from the CMOS inverter IV8 is inverted by the CMOS inverter formed by the MOS transistors T52 and T53. The result is that an unstable clock signal is delivered as shown in FIG. 12E.

Where the steady-state amplitude of the oscillation signal is small in this way, the related art technique of FIG. 9 rather suffers from the problem that the clock signal produced to a circuit at a later stage is made unstable.

This may be eliminated by the setting of the charge-discharge time constant of the capacitor C7. However, this adversely affects the operation. In addition, as higher frequency and lower voltage are used, the accuracy presents problems. In this way, problems still exist.

SUMMARY OF THE INVENTION

Accordingly, it is an object of the present invention to provide an oscillation control circuit capable of producing a stable clock signal to a circuit at a later stage even if the steady-state amplitude of the oscillation signal is small and of improving the startability of an oscillator circuit that is operated at a high frequency and at a low power-supply voltage.

The present invention provides an oscillation control circuit comprising: a pair of power lines; an oscillator circuit having a first CMOS inverter and a piezoelectric oscillator connected between the output and input terminals of the first CMOS inverter; a second CMOS inverter for receiving an oscillation signal produced from the first CMOS inverter; a control MOS transistor connected between the source of at least one of N- and P-channel transistors forming the second CMOS inverter and at least one of the power lines; and an operation control circuit for maintaining the control MOS transistor in cutoff until the amplitude of the oscillation signal exceeds a given value. The operation control circuit has a capacitor and a Schmitt trigger having input/output characteristics having given hysteresis. The capacitor is charged and discharged according to the oscillation signal. The Schmitt trigger controls the control MOS transistor according to the charging voltage for the capacitor.

An output control circuit may be provided to short the output of the second CMOS transistor to one of the power lines when the control MOS transistor is in cutoff.

The operation control circuit charges the aforementioned capacitor during the period in which the oscillation potential of the oscillation signal is lower than a first reference potential that is lower than the inversion potential of the first CMOS inverter or the oscillation potential of the oscillation signal is higher than a second reference potential that is higher than the inversion potential of the first CMOS inverter. The operation control circuit discharges the capacitor during the remaining period. The output from the Schmitt trigger takes the first logical value when the charging voltage increases beyond a first threshold value. The output from the Schmitt trigger takes the second logical value when the charging voltage drops below a second threshold value that is lower than the first threshold value. The control MOS transistor may be turned ON according to the first logical output value of the output from the Schmitt trigger.

Furthermore, the above-described operation control circuit may discharge the aforementioned capacitor during the period in which the oscillation potential of the oscillation signal is lower than the first reference potential that is lower than the inversion potential of the first CMOS inverter or the oscillation potential of the oscillation signal is higher than the second reference potential that is higher than the inversion potential of the first CMOS inverter. During the remaining period, the operation control circuit charges the capacitor. When the charging voltage drops below the first threshold value, the output from the Schmitt trigger assumes the first logical output value. When the charging voltage increases above the second threshold value that is higher than the first threshold value, the output from the Schmitt trigger takes the second logical output value. The control MOS transistor may be turned ON according to the first logical output value of the output from the Schmitt trigger.

DESCRIPTION OF THE PREFERRED EMBODIMENTS

Figure 1:
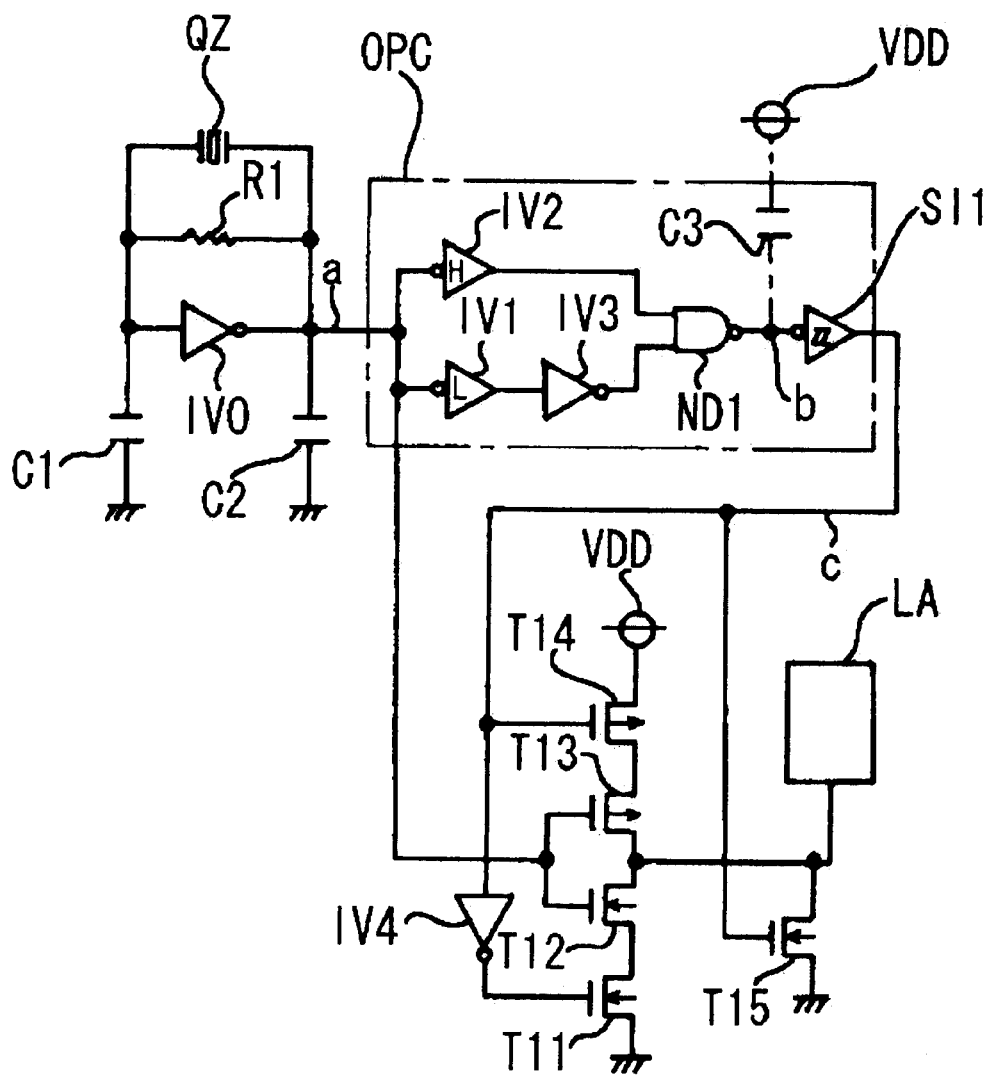
FIG. 1 is an electrical circuit diagram of an oscillation control circuit illustrating one embodiment of the present invention.

Embodiments of the present invention are hereinafter described in detail with reference to the illustrative embodiments shown in the drawings.

FIG. 1 is an electrical circuit diagram of an oscillation control circuit in accordance with a first embodiment. FIGS. 2A, 2B, 2C, and 2D are a characteristic diagram showing the input/output characteristics (transfer characteristics) of a CMOS inverter in FIG. 1.

In the present embodiment, a quartz oscillator for overtone oscillation of a small-sized rectangular package measuring 3 mm×5 mm for achieving higher frequencies is used. The power-supply voltage is set to 3.0 volts for achieving lower power consumption. The piezoelectric oscillator is not limited to a quartz oscillator. It may also be a surface acoustic wave (SAW) oscillator or the like.

Figure 2A:
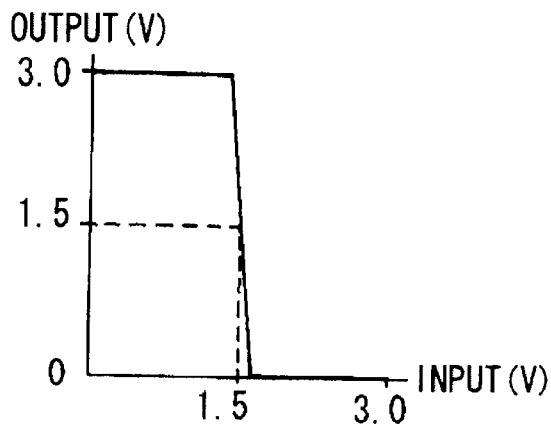
FIGS. 2A, 2B, 2C, and 2D are a characteristic diagram showing input/output characteristics (transfer characteristics) of CMOS inverters in FIGS. 1, 4, 5, and 7.

A CMOS inverter IV0 has input/output characteristics (transfer characteristics) as shown in FIG. 2A. Its inversion potential (logical threshold voltage) is set to 1.5 volts in this embodiment. The inversion potential referred to herein is an input voltage midway between the fall start input voltage and the fall end input voltage of the input/output characteristics. Normally, it is the input voltage when the output voltage (1.5 V) is half the power-supply voltage (3.0 V). A quartz oscillator QZ and a feedback resistor R1 are connected in parallel between the input and output of the CMOS inverter IV0. The input and output terminals are grounded via capacitors C1 and C2, respectively. The CMOS inverter IVO, quartz oscillator QZ, feedback resistor R1, and capacitors C1, C2 described thus far together form an oscillator circuit.

Figure 2B:
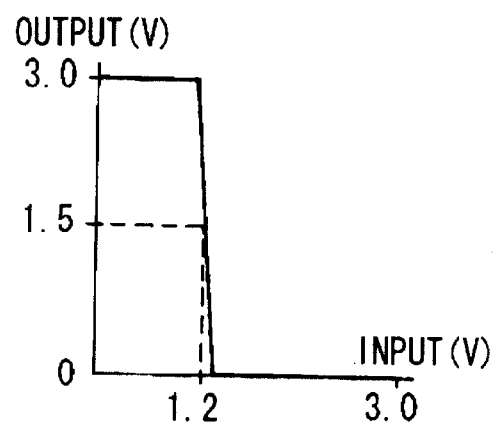
Figure 2C:
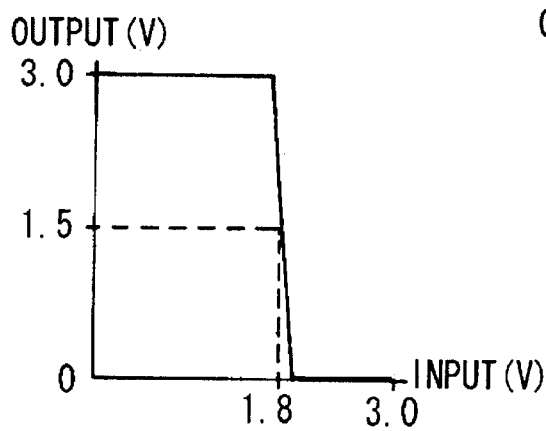
Figure 2D:
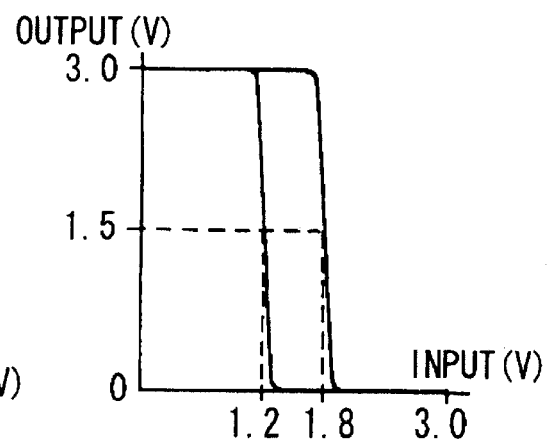

A CMOS inverter IV1 has input/output characteristics as shown in FIG. 2B. Its inversion potential is 1.2 volts in this embodiment. A symbol "L" indicating an inverter will be hereinafter given to such a CMOS inverter. A CMOS inverter IV2 has input/output characteristics as shown in FIG. 2C, and its inversion potential is 1.8 volts in this embodiment. A symbol "H" indicating an inverter will be hereinafter given to such a CMOS inverter. Any inverter to which neither "L" nor "H" is given has input/output characteristics similar to those of the CMOS inverter IVO as shown in FIG. 2A, unless otherwise specified. Its inversion potential is 1.5 volts in this embodiment. A CMOS Schmitt inverter SI1 acting as a Schmitt trigger has input/output characteristics as shown in FIG. 2D. In this embodiment, where the input voltage rises, the first inversion potential is 1.8 volts. Where the input voltage drops, the second inversion potential is 1.2 volts and thus the input voltage has a hysteresis of 0.6 volt. The input terminal of the CMOS inverter IV1 is connected with the output terminal of the CMOS inverter IV0, while the output terminal is connected with a CMOS NAND gate ND1 via the CMOS inverter IV3. The input terminal of the CMOS inverter IV2 is connected with the output terminal of the CMOS inverter IV0, whereas the output terminal is connected with the CMOS NAND gate ND1. The junction of the output terminal of the CMOS NAND gate ND1 and the input terminal of the CMOS Schmitt inverter SI1 is connected with a power supply terminal VDD via a capacitor C3. The CMOS inverters IV1, IV2, IV3, CMOS NAND gate ND1, capacitor C3, and CMOS Schmitt inverter SI1 described thus far together form an operation control circuit OPC.

The gate of a P-channel MOS transistor T14 is connected with the output terminal of the CMOS Schmitt inverter SI1. The gate of an N-channel MOS transistor T11 is connected with the output terminal of the CMOS Schmitt inverter SI1 via the CMOS inverter IV4. The junction of the gates of an N-channel MOS transistor T12 and of a P-channel MOS transistor T13 is connected with the output terminal of the CMOS inverter IV0. The junction of their drains is connected with a circuit LA at a later stage. The source of the N-channel MOS transistor T12 is grounded via the source/drain of the N-channel MOS transistor T11. The source of the P-channel MOS transistor T13 is connected with the power supply terminal VDD via the source/drain of a P-channel MOS transistor Tl4. The CMOS inverter IV4, N-channel MOS transistors T11, T12, and P-channel MOS transistors T13, T14 described thus far together form a CMOS clocked inverter. The circuit LA at the later stage is connected with the output of this CMOS clocked inverter.

An N-channel MOS transistor T15 shorts out the output of the CMOS inverter formed by the MOS transistors T12 and T13 when the logical output value of the CMOS Schmitt inverter SI1 is 1.

The gate circuits such as inverters, MOS transistors, and circuit LA at the later stage shown in FIG. 1 are packaged within the same IC chip.

Figure 3:
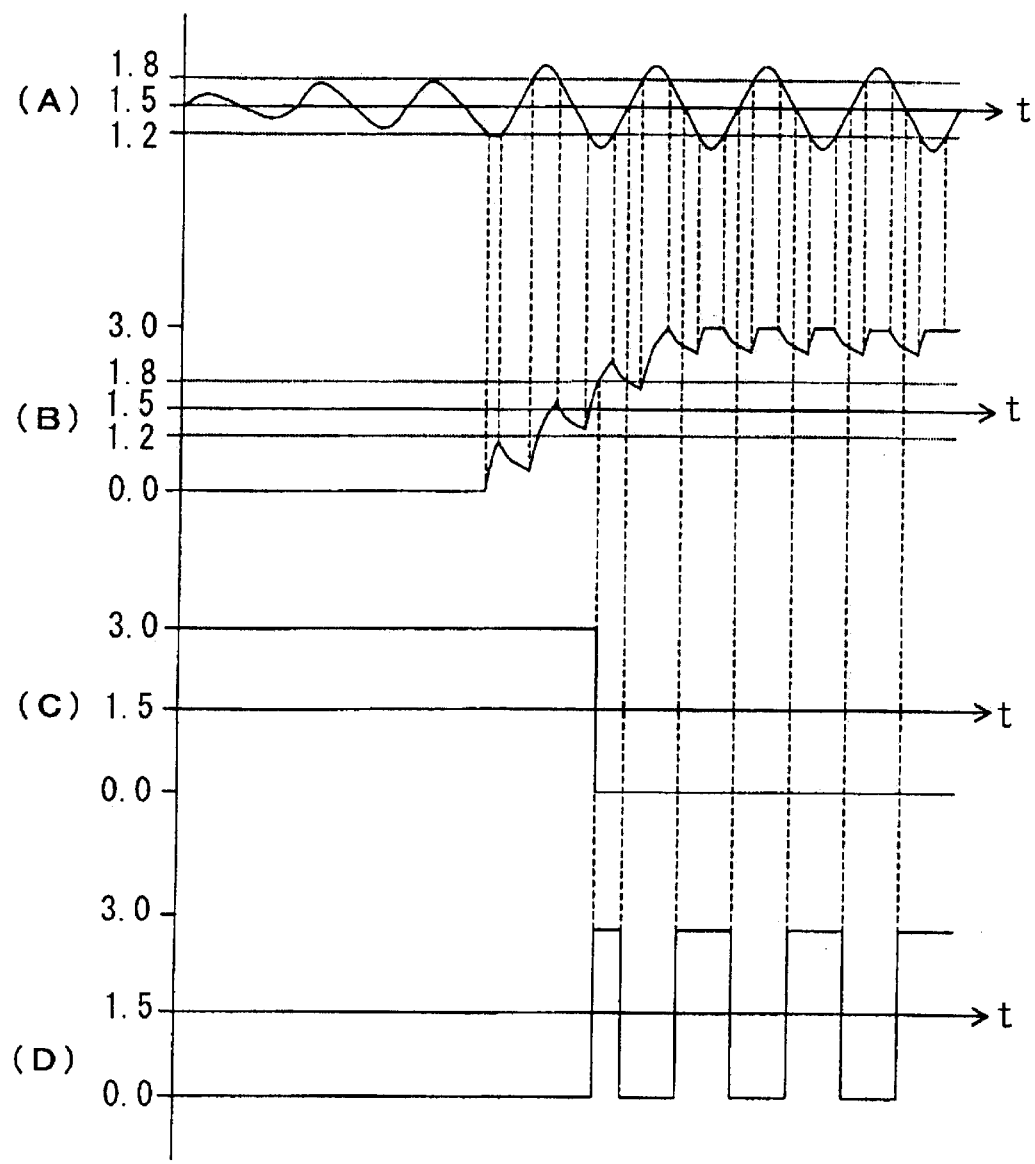
FIG. 3 is a time chart illustrating the operation of FIGS. 1 and 4.

The operation of the electric circuit of FIG. 1 is described by referring to the time chart of FIG. 3. A, B, C, and D of FIG. 3 correspond to a, b, c, and d, respectively, of FIG.1.

As shown in FIG. 3A, when the power supply is turned on, the CMOS inverter IVO produces an oscillation signal of minute amplitude. The amplitude of this oscillation signal increases gradually. When its oscillation potential is between the inversion potential (1.2 volts) of the CMOS inverter IV1 and the inversion potential (1.8 volts) of the CMOS inverter IV2, the logical output value of the CMOS inverter IV1 is 0, and the logical output value of the CMOS inverter IV2 is 1. The output from the CMOS NAND gate ND1 assumes a logical value of 0, and the capacitor C3 has been charged. Thus, the logical output value of the CMOS Schmitt inverter SI1 is 1. Accordingly, the MOS transistors T11 and T14 are turned off. The CMOS inverter formed by the MOS transistors T12 and T13 is deactivated. At this time, the MOS transistor T15 is ON. The output of the CMOS inverter formed by the MOS transistors T12 and T13 is shorted out via a MOS transistor T15.

When the oscillation potential of the oscillation signal drops below the inversion potential (1.2 volts) of the CMOS inverter IV1 or increases above the inversion potential (1.8 volts) of the CMOS inverter IV2, the output from the CMOS NAND gate ND1 assumes a logical value of 1. At this time, the capacitor C3 is discharged, the charging voltage across the capacitor C3 is made to drop, and the potential at the terminal b of the capacitor C3 is elevated by appropriately setting the value of the capacitor C3 and the ON-state resistance value of the MOS transistor forming the CMOS NAND gate ND1. That is, the input voltage to the CMOS Schmitt inverter SI1 rises rapidly (FIG. 3B). This charging and discharging process is repeated. If the input voltage to the CMOS Schmitt inverter SI1 increases above its first inversion potential (1.8 volts), the logical output value of the CMOS Schmitt inverter SI1 makes an inversion from 1 to 0. As a result, the CMOS inverter formed by the MOS transistors T12 and T13 is first set into operation. At the same time, the MOS transistor T15 is cut off. The oscillation signal generated from the CMOS inverter IVO is inverted by the CMOS inverter formed by the MOS transistors T12 and T13. A clock signal with duty factor 50% can be delivered as shown in FIG. 3D. This inverted output (clock signal) activates the circuit LA at the later stage.

Where the oscillator circuit uses a small-sized piezoelectric oscillator (e.g., a quartz oscillator) for RF oscillation and operates at a low power-supply voltage as in the present embodiment, the steady-state amplitude is small. In addition, it takes longer to make a transition from a minute amplitude at the beginning of oscillation to the steady-state amplitude than conventional. Therefore, the potential at the terminal b of the capacitor C3 rises more mildly than conventional while varying because of the aforementioned charging and discharging process. The potential may rise once beyond the first inversion potential (1.8 volts) of the Schmitt inverter SI1 and drop past this potential. The logical output value of the Schmitt inverter SI1 is maintained at 1 unless the potential drops below the second inversion potential (1.2 volts). That is, the hysteresis characteristics of the Schmitt inverter SI1 suppress the phenomenon that the logical output value of the Schmitt inverter SI1 that once assumes a value of 1 is inverted to 0 due to a minute variation in the potential at the terminal b of the capacitor C3. Accordingly, even the aforementioned oscillator circuit of small steady-state amplitude can minimize instability of the clock signal to the circuit at the later stage when a transition is made from a minute amplitude to the steady-state amplitude. Hence, a stable clock signal can be delivered to the circuit at the later stage.

As described thus far, in the present embodiment, if the steady-state amplitude of the oscillation signal is small, a stable clock signal can be delivered to the circuit at the later stage. Therefore, even an oscillator circuit operating at a high frequency and at a lower power-supply voltage in a manner unachievable heretofore can adopt a structure that can prevent the oscillation operation from being hindered by the effects of noise on the oscillator portion from the circuit at the later stage by stopping the operation of the circuit at the later stage until a transition is made from a minute amplitude at the beginning of oscillation to steady-state amplitude.

In the present embodiment, the MOS transistor T15 is made of an N-channel MOS transistor. It may also be made of a P-channel MOS transistor by using a logical value opposite to the logical output value of the CMOS Schmitt inverter SI1.

An oscillation control circuit in accordance with a second embodiment of the present invention is next described. In the present embodiment, as shown in FIG. 4, the functions possessed by the clocked inverter (CMOS inverter IV4, N-channel MOS transistors T11, T12, and P-channel MOS transistors T13, T14) and the shorting MOS transistor T15 in the embodiment illustrated in FIG. 1 are replaced by other functions.

The gates of an N-channel MOS transistor T21 and of a P-channel MOS transistor T24 are connected with the output terminal of the CMOS Schmitt inverter SI1. The source of the N-channel MOS transistor T21 is grounded, while the drain is connected with the circuit LA at the later stage. The gate of a P-channel MOS transistor T23 is connected with the output terminal of the CMOS inverter IV0, the drain is connected with the circuit LA at the later stage, and the source is connected with the power supply terminal VDD via the source/drain of the P-channel MOS transistor T24. The gate of the N-channel MOS transistor T22 is connected with the output terminal of the CMOS inverter IV0, the drain is connected with the circuit LA at the later stage, and the source is grounded. The N-channel MOS transistors T21, T22 and P-channel MOS transistors T23, T24 described thus far together form a CMOS NOR gate. The function of this CMOS NOR gate replaces the functions possessed by the clocked inverter and shorting MOS transistor in the embodiment of FIG. 1.

Figure 4:
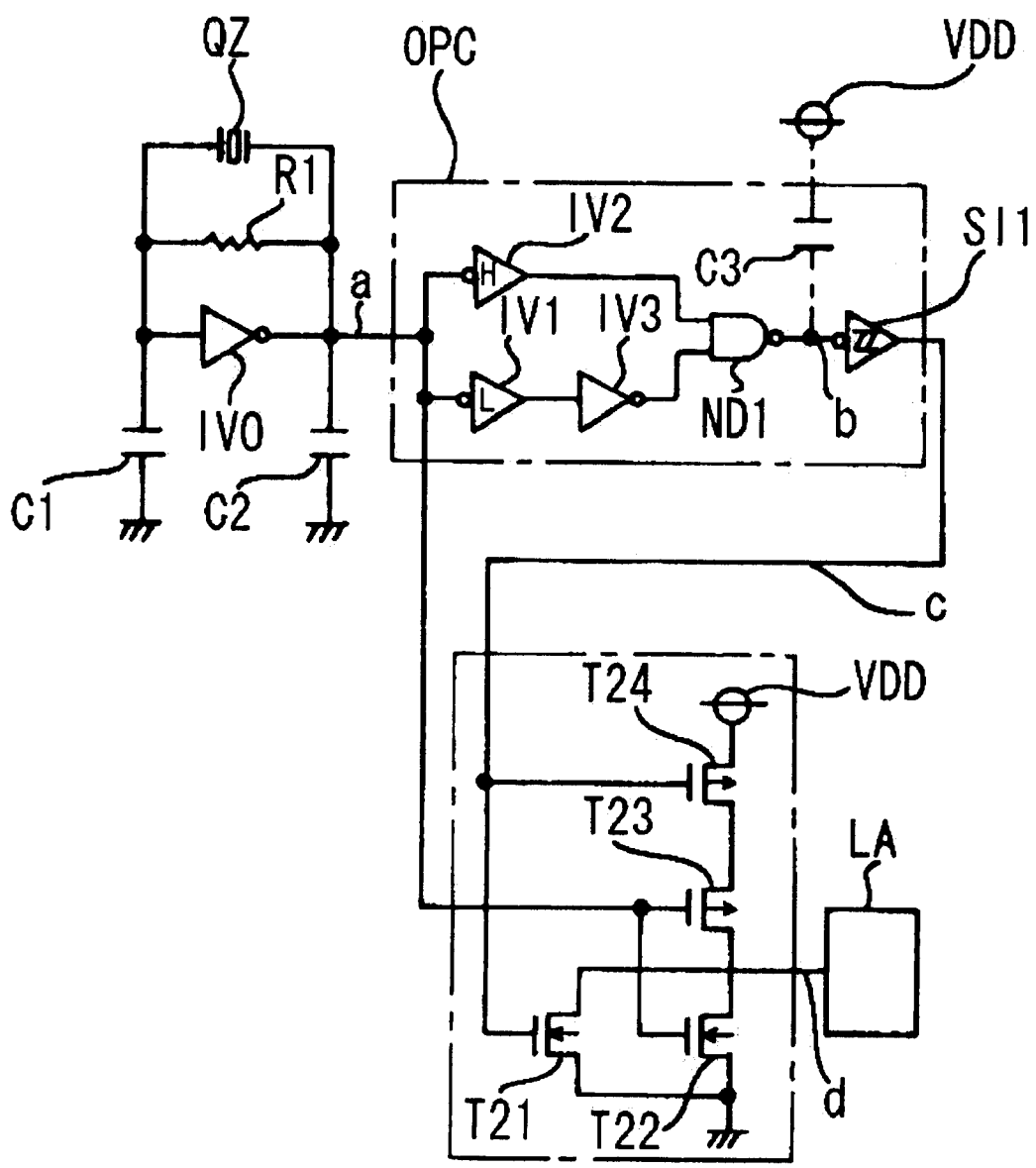
FIG. 4 is an electrical circuit diagram of an oscillation control circuit illustrating another embodiment of the invention.

In FIG. 4, the circuitry other than the CMOS NOR gate (N-channel MOS transistors T21, T22 and P-channel MOS transistors T23, T24) is the same as that of FIG. 1. Those components which are identical with the respective counterparts of the embodiment of FIG. 1 are denoted by the same reference numerals as in FIG. 1 and their description is omitted. The input/output characteristics of the inverters are shown in FIG. 2 in the same way as in the above embodiment. Other gate circuits and so on functioning substantially as inverters have input/output characteristics as shown in FIG. 2A unless otherwise specified. In this embodiment, the inversion potential is 1.5 volts. Symbols "L" and "H" given to inverters have the same meanings as in the above embodiment. Also, with respect to the time chart, FIG. 3 is quoted. That is, A, B, C, and D of FIG. 3 correspond to points a, b, c, and d, respectively, of FIG. 1.

The gate circuits such as inverters, MOS transistors, and circuit LA at the later stage shown in FIG. 4 are packaged within the same IC chip.

The operation of the present embodiment is described next by referring to FIG. 3.

When the oscillation potential of the oscillation signal produced from the CMOS inverter IV0 is between the inversion potential (1.2 volts) of the CMOS inverter IV1 and the inversion potential (1.8 volts) of the CMOS inverter IV2, the logical output value of the CMOS NAND gate ND1 is 0, while the logical output value of the CMOS Schmitt inverter SI1 is 1. Therefore, the MOS transistor T21 is turned on, whereas the MOS transistor T24 is turned off. As a result, the output of the CMOS inverter formed by the MOS transistors T22 and T23 is shorted out through the MOS transistor T21. The CMOS inverter formed by the MOS transistors T22 and T23 is maintained inactive until the oscillation potential of the oscillation signal decreases below the inversion potential (1.2 volts) of the CMOS inverter IV1 or increases beyond the inversion potential (1.8 volts) of the CMOS inverter IV2. Its logical output value is kept at 0.

When the oscillation potential of the oscillation signal decreases below the inversion potential (1.2 volts) of the CMOS inverter IV1 or increases above the inversion potential (1.8 volts) of the CMOS inverter IV2, the capacitor C3 is discharged by appropriately selecting the value of the capacitor C3 and the ON-state resistance value of the MOS transistor forming the CMOS NAND gate ND1. The input voltage to the CMOS Schmitt inverter SI1 increases. When the input voltage to the CMOS Schmitt inverter SI1 becomes higher than the inversion potential (1.8 volts), the logical output value of the CMOS Schmitt inverter SI1 makes an inversion from 1 to 0. As a result, the MOS transistor T21 is turned off, while the MOS transistor T24 is turned on. The CMOS inverter formed by the MOS transistors T22 and T23 is first set into operation. The subsequent operation is fundamentally the same as the operation described in the first embodiment shown in FIG. 1 and its description is omitted.

An oscillation control circuit in accordance with a third embodiment of the present invention is next described. In the present embodiment, the functions possessed by the clocked inverter (CMOS inverter IV4, N-channel MOS transistors T11, T12, and P-channel MOS transistors T13, T14) and the shorting MOS transistor T15 in the above embodiment shown in FIG. 1 are replaced by other functions as shown in FIG. 5.

The input terminal of the CMOS inverter IV5 is connected with the output terminal of the CMOS Schmitt inverter SI1, while the output terminal is connected with the gates of the N-channel MOS transistor T31 and of the P-channel MOS transistor T34. The drain of the P-channel MOS transistor T34 is connected with the power supply terminal VDD, whereas the source is connected with the circuit LA at the later stage. The gate of the P-channel MOS transistor T33 is connected with the output terminal of the CMOS inverter IV0, the source is connected with the circuit LA at the later stage, and the drain is connected with the power supply terminal VDD. The gate of the N-channel MOS transistor T32 is connected with the output terminal of the CMOS inverter IV0, and the drain is connected with the circuit LA at the later stage. The source is grounded via the source/drain of the N-channel MOS transistor T31. The N-channel MOS transistors T31, T32 and P-channel MOS transistors T33, T34 described thus far together form a CMOS NAND gate. The functions of this CMOS NAND gate replace the functions possessed by the clocked inverter and shorting MOS transistor in the embodiment of FIG. 1.

Figure 5:
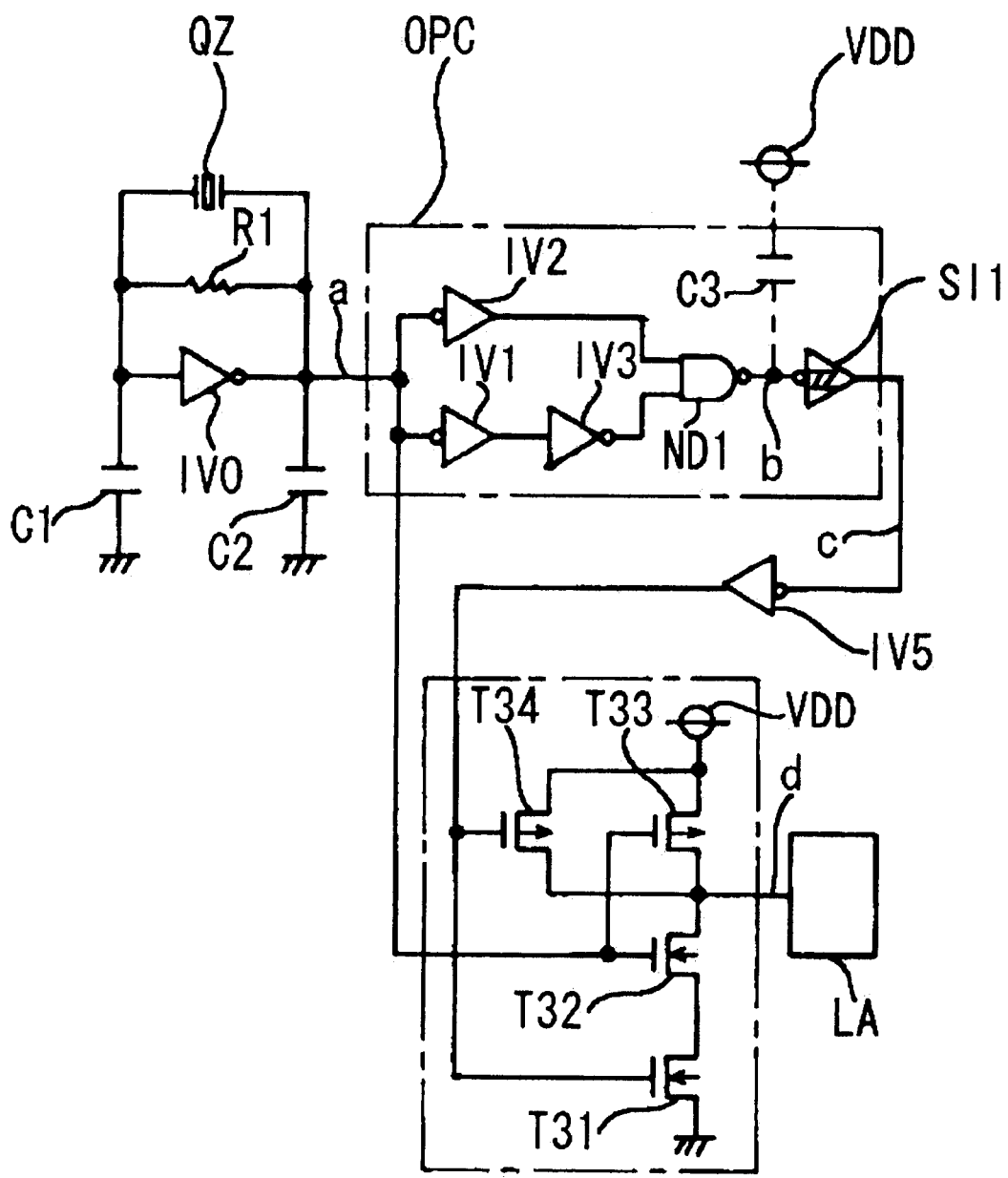
FIG. 5 is an electrical circuit diagram of an oscillation control circuit illustrating a further embodiment of the invention.

In FIG. 5, the circuitry other than the CMOS NAND gate (N-channel MOS transistors T31, T32 and P-channel MOS transistors T33, T34) is the same as that of FIG. 1. The components which are the same as the components shown in FIG. 1 are indicated by the same numerals as in FIG. 1 and their description is omitted. The input/output characteristics of the various inverters are shown in FIG. 2 in the same way as in the above embodiments. Other gate circuits and so on which function substantially as inverters have input/output characteristics as shown in FIG. 2A, unless otherwise stated. Its inversion potential is 1.5 volts. The symbols "L" and "H" given to inverters have the same meanings as described in the above embodiments.

The gate circuits such as inverters, MOS transistors, and circuit LA at the later stage shown in FIG. 5 are packaged within the same IC chip.

Figure 6:
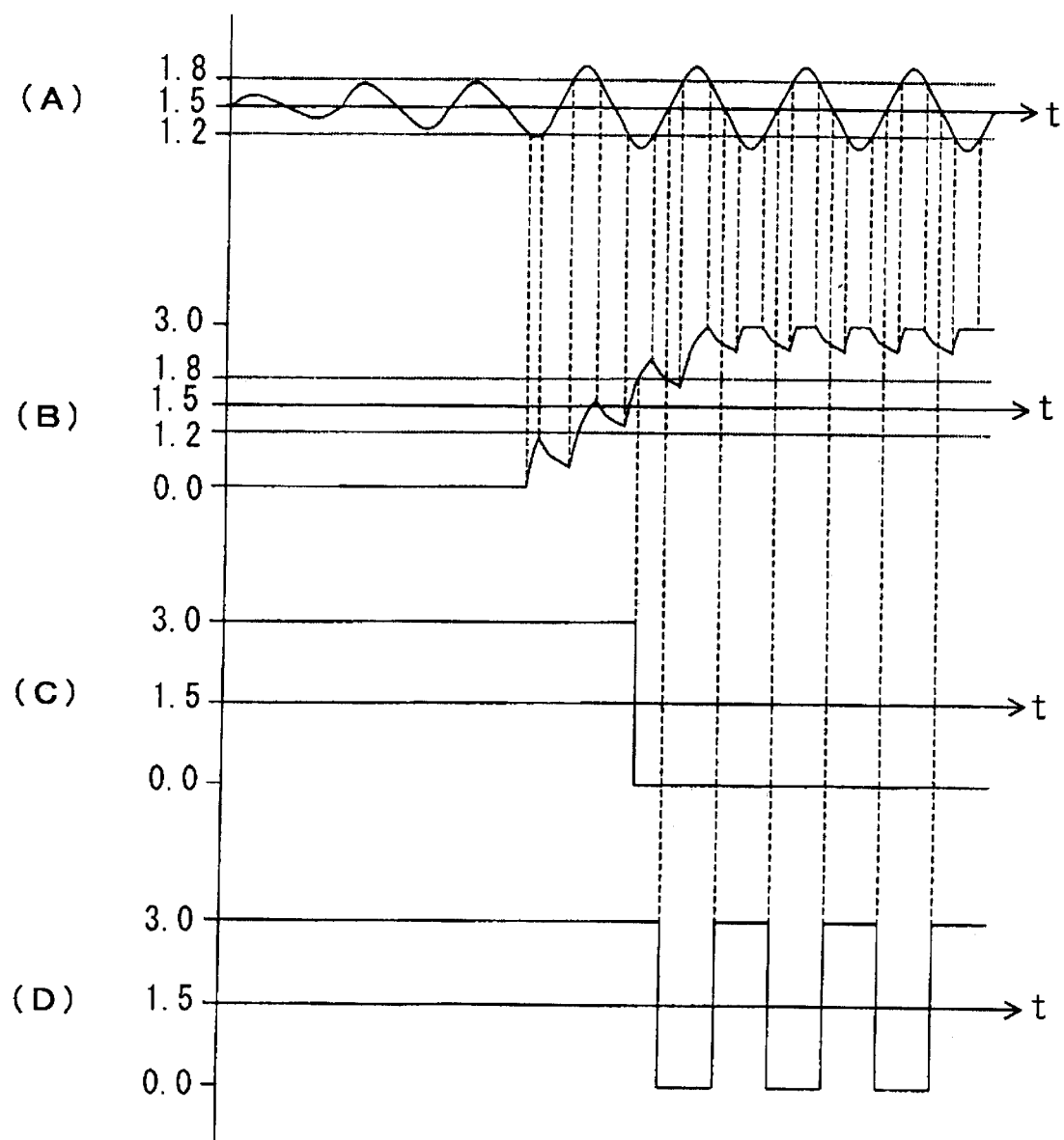
FIG. 6 is a time chart illustrating the operation of FIG. 5.

The operation of the present embodiment is described by referring to the time chart of FIG. 6. A, B, C, and D of FIG. 6 correspond to a, b, c, and d, respectively, of FIG. 1.

When the oscillation potential of the oscillation signal produced from the CMOS inverter IV0 is between the inversion potential (1.2 volts) of the CMOS inverter IV1 and the inversion potential (1.8 volts) of the CMOS inverter IV2, the logical output value of the CMOS Schmitt inverter SI1 is 1, while the logical output value of the CMOS inverter IV5 is 0. Therefore, the MOS transistor T31 is turned off, whereas the MOS transistor T34 is turned on. As a result, the output of the CMOS inverter formed by the MOS transistors T32 and T33 is shorted out through the MOS transistor T34. The CMOS inverter formed by the MOS transistors T32 and T33 is maintained inactive until the oscillation potential of the oscillation signal decreases below the inversion potential (1.2 volts) of the CMOS inverter IV1 or increases beyond the inversion potential (1.8 volts) of the CMOS inverter IV2. Its logical output value is kept at 1.

When the oscillation potential of the oscillation signal decreases below the inversion potential (1.2 volts) of the CMOS inverter IV1 or increases above the inversion potential (1.8 volts) of the CMOS inverter IV2, the capacitor C3 is discharged by appropriately selecting the value of the capacitor C3 and the ON-atate resistance value of the MOS transistor forming the CMOS NAND gate ND1. The input voltage to the CMOS Schmitt inverter SI1 increases. When the input voltage to the CMOS Schmitt inverter SI1 becomes higher than the inversion potential (1.8 volts), the logical output value of the CMOS Schmitt inverter SI1 makes an inversion from 1 to 0. As a result, the MOS transistor T31 is turned on, while the MOS transistor T34 is turned off. The CMOS inverter formed by the MOS transistors T32 and T33 is first set into operation. The oscillation signal produced from the CMOS inverter IV0 is inverted by the CMOS inverter formed by the MOS transistors T12 and T13, and can deliver a clock signal having a duty cycle of 50% as shown in FIG. 6D. This inverted output (clock signal) sets the circuit LA at the later stage into operation.

In this way, the present embodiment produces the same effect as the first embodiment by the same operation. That is, even if the steady-state amplitude of the oscillation signal is small, a stable clock signal can be delivered to the circuit at the later stage.

Figure 7:
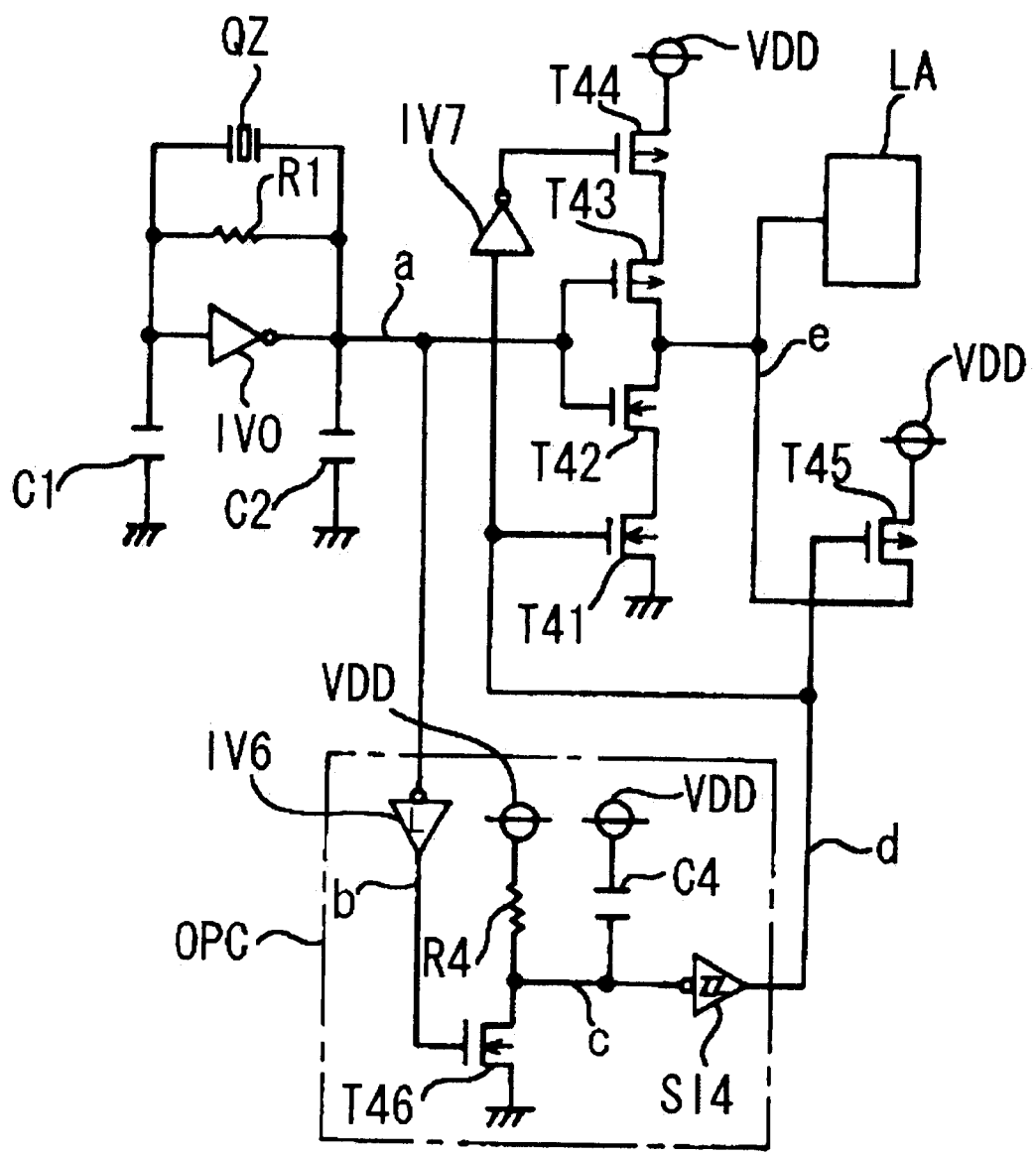
FIG. 7 is an electrical circuit diagram of an oscillation control circuit illustrating a yet other embodiment of the invention.

An oscillation control circuit in accordance with a fourth embodiment of the present invention is next shown in FIG. 7.

In FIG. 7, the oscillator circuit (CMOS inverter IV0, quartz oscillator QZ, feedback resistor R1, and capacitors C1, C2) is the same as that of FIG. 1. Those components which are the same as their counterparts of the embodiment illustrated in FIG. 1 are indicated by the same numerals as in FIG. 1 and their description is omitted. Also, the input/output characteristics of the various inverters are the same as shown in FIG. 2, in the same way as in the above embodiments. Other gate circuits and soon which function substantially as inverters have input/output characteristics as shown in FIG. 2A, unless otherwise specified. Their inversion potential is 1.5 volts. The symbol "L" given to the inverters has the same meaning as described in the above embodiments.

The CMOS Schmitt inverter SI4 acting as a Schmitt trigger has input/output characteristics as shown in FIG. 2D. In this embodiment, the first inversion potential in the case where the input voltage rises is 1.8 volts, and the second inversion potential in the case where the input voltage drops is 1.2 volts. Thus, it has a hysteresis of 0.6 volt. The input terminal of the CMOS inverter IV6 is connected with the output terminal of the CMOS inverter IV0, while the output terminal is connected with the gate of the N-channel MOS transistor T46. The source of the N-channel MOS transistor T46 is grounded, the drain is connected with one end of the resistor R4, with one end of the capacitor C4 and with the input terminal of the CMOS Schmitt inverter SI4, and the other end of the resistor R4 and the other end of the capacitor C4 are connected with the power supply terminal VDD (3.0 volts). The resistance value of the resistor R4 is sufficiently larger than the ON-state resistance value of the MOS transistor T46. The CMOS inverter IV6, CMOS Schmitt inverter SI4, MOS transistor T46, resistor R4, and the capacitor C4 together form an operation control circuit OPC.

The gate of the N-channel MOS transistor T41 is connected with the output terminal of the CMOS Schmitt inverter SI4, and the gate of the P-channel MOS transistor T44 is connected with the output terminal of the CMOS Schmitt inverter SI4 via the CMOS inverter IV7. The junction of the gates of the N-channel MOS transistor T42 and the P-channel MOS transistor T43 is connected with the output terminal of the CMOS inverter IV0. The junction of their drains is connected with the circuit LA at the later stage. The source of the N-channel MOS transistor T42 is grounded via the source/drain of the N-channel MOS transistor T41. The source of the P-channel MOS transistor T43 is connected with the power supply terminal VDD via the source/drain of the P-channel MOS transistor T44. The CMOS inverter IV7, N-channel MOS transistors T41, T42, and P-channel MOS transistors T43, T44 described thus far together form a CMOS clocked inverter. The circuit LA at the later stage is connected with the output of this CMOS clocked inverter.

The P-channel MOS transistor T45 shorts out the output of the CMOS inverter formed by the MOS transistors T42 and T43 when the logical output value of the CMOS Schmitt inverter SI4 is 0.

The gate circuits such as inverters, MOS transistors, and circuit LA at the later stage shown in FIG. 7 are packaged within the same IC chip.

Figure 8:
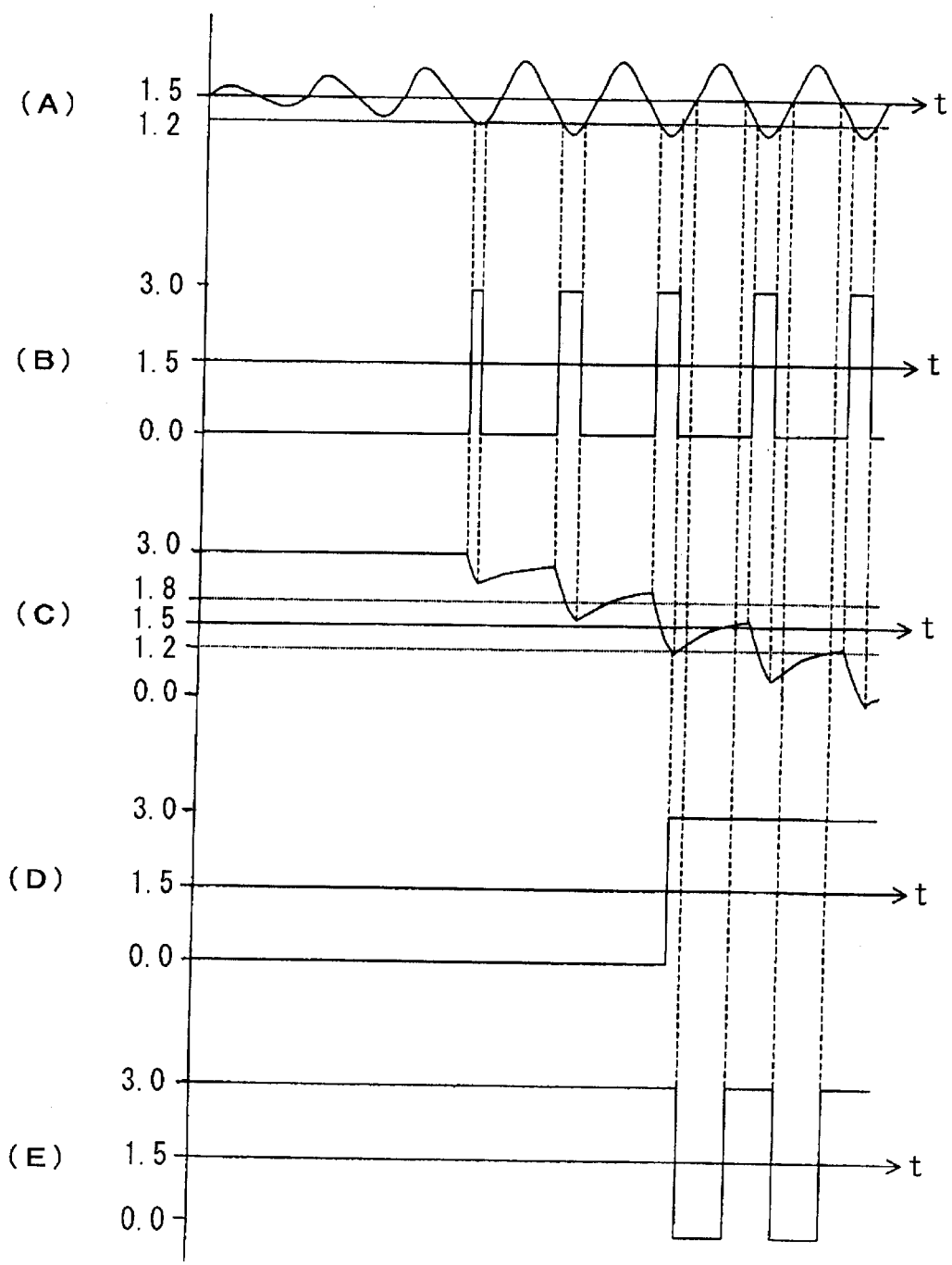
FIG. 8 is a time chart illustrating the operation of FIG. 7.
Figure 9:
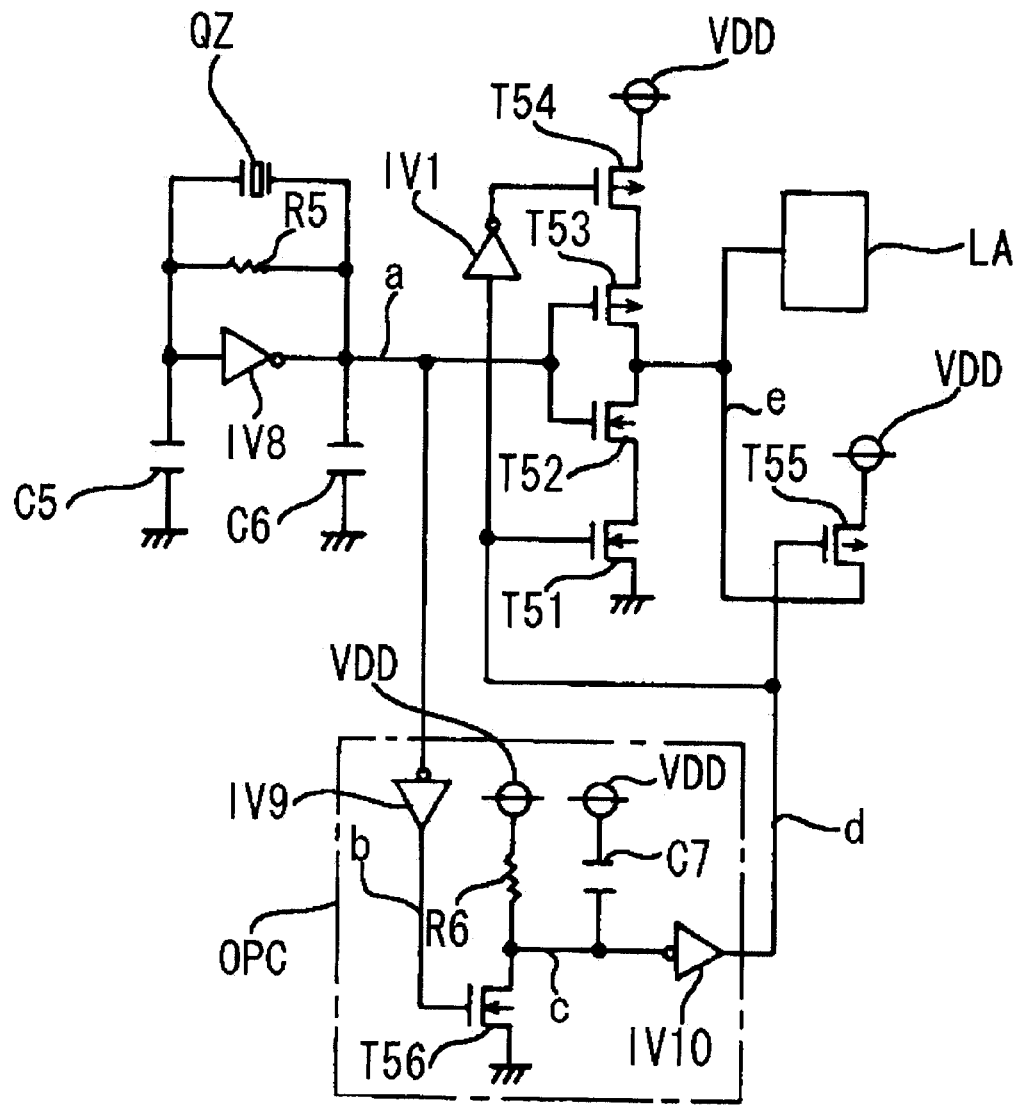
FIG. 9 is an electrical circuit diagram of an oscillation control circuit illustrating a related art example.
Figure 10A:
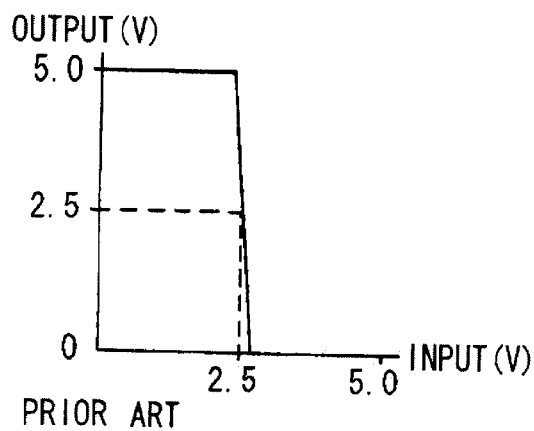
FIGS. 10A, 10B, and 10C are a characteristic diagram showing the input/output characteristics (transfer characteristics) of the CMOS inverters in FIG. 9.
Figure 10B:
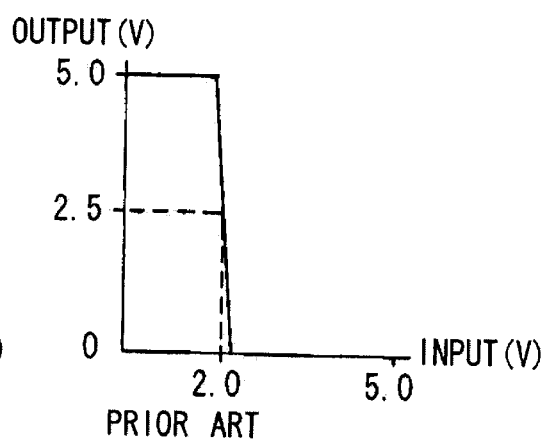
Figure 10C:
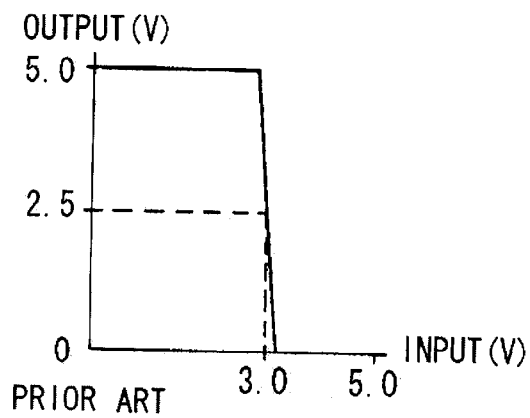
Figure 11:
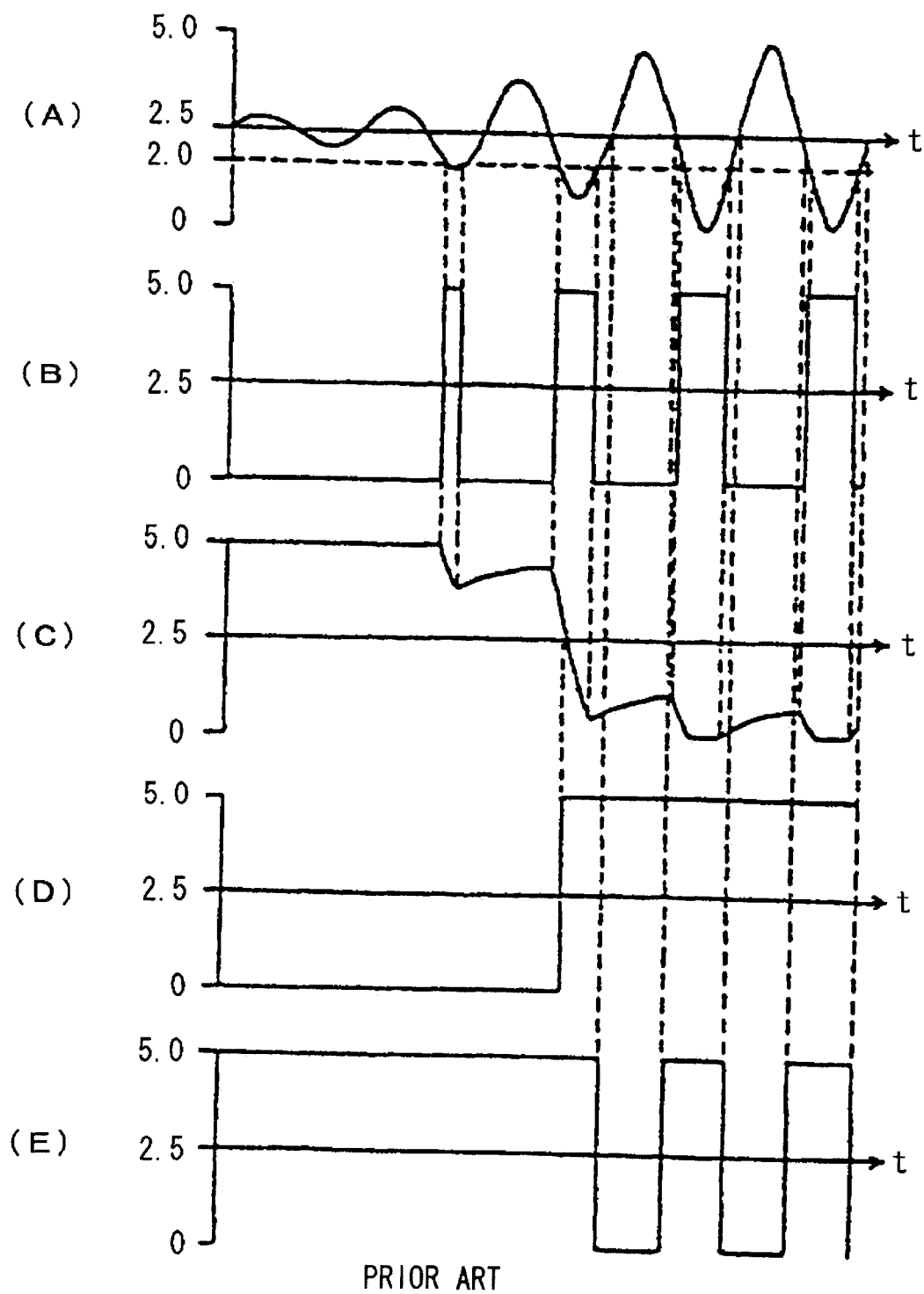
FIG. 11 is a time chart illustrating the operation of FIG. 9.
Figure 12:
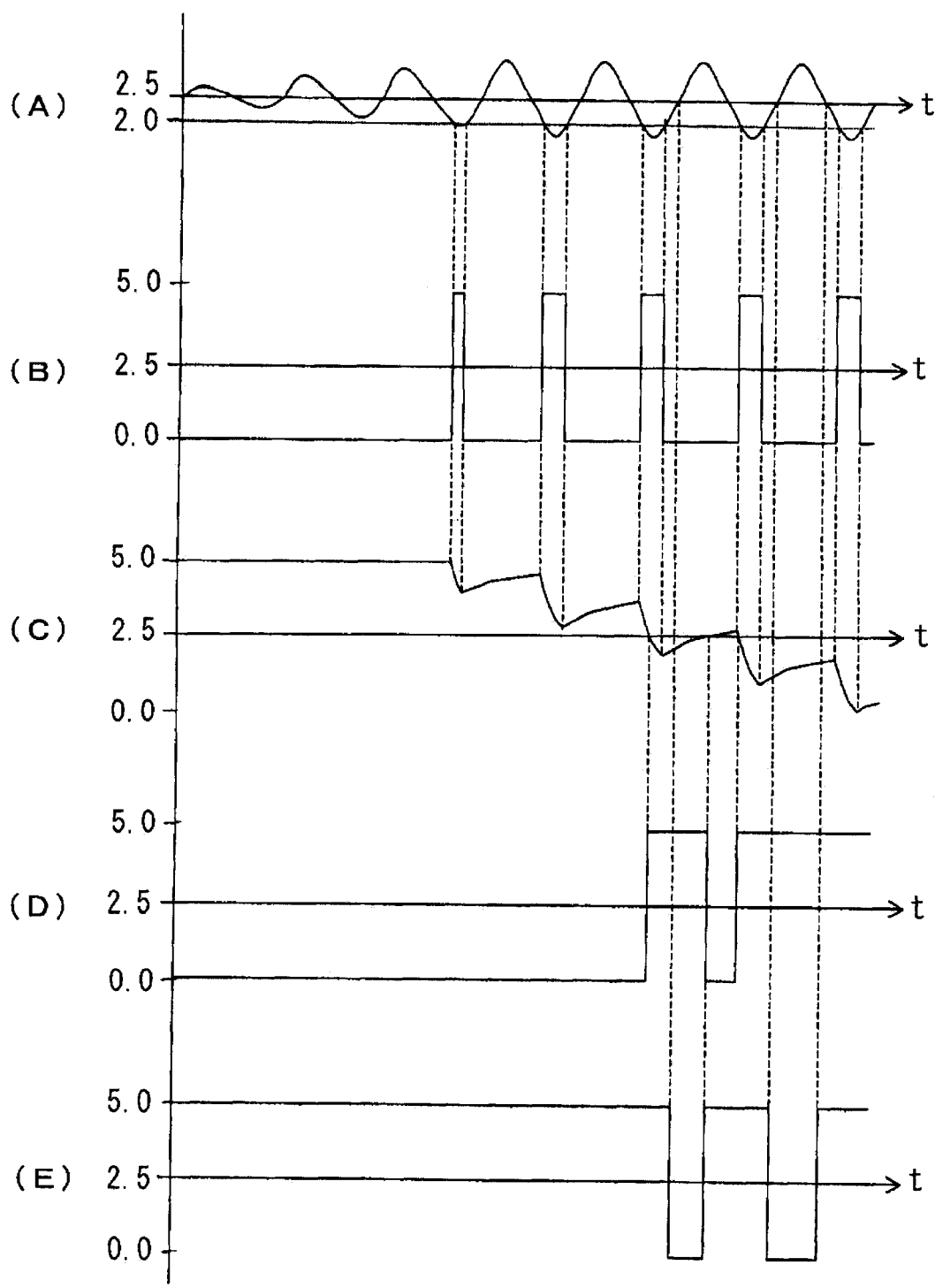
FIG. 12 is a time chart illustrating the operation of FIG. 9.

The operation of the present embodiment is described by referring to the time chart of FIG. 8. A, B, C, D, and E of FIG. 8 correspond to a, b, c, d, and e, respectively, of FIG. 7.

As shown in FIG. 8A, when the power supply is turned on, the CMOS inverter IV0 produces an oscillation signal of small amplitude. Although the amplitude of this oscillation signal increases gradually, the logical output value of the CMOS inverter IV6 remains at 0 until the oscillation potential decreases below the inversion potential (1.2 volts) of the CMOS inverter IV6 (FIG. 8B). Therefore, the MOS transistor T46 is turned off. The capacitor C4 is discharged. The logical output value at the terminal c of the capacitor C4 is 1. That is, the logical output value of the CMOS Schmitt inverter SI4 is 0 (FIG. 8D). As a result, the MOS transistors T41 and T44 are turned off. The CMOS inverter formed by the MOS transistors T42 and T43 is made inactive. At this time, the MOS transistor T45 is ON and so the output of the CMOS inverter formed by the MOS transistors T42 and T43 is shorted out through the MOS transistor T45. In this way, the CMOS inverter formed by the MOS transistors T42 and T43 is maintained inactive at the initial phase of oscillation until the second inversion potential (1.2 volts) of the Schmitt inverter SI4 is exceeded. Its logical output value is held at 1.

When the oscillation potential of the oscillation signal exceeds the inversion potential (1.2 volts) of the CMOS inverter IV6, the logical output value of the CMOS inverter IV6 assumes a value of 1 (FIG. 8B), turning on the MOS transistor T46. As a result, as shown in FIG. 8C, the capacitor C4 is charged through the MOS transistor T46. The charging voltage across the capacitor C4 rises. The potential at the terminal c of the capacitor C4, i.e., the input voltage to the CMOS Schmitt inverter SI4, decreases. When the MOS transistor T46 is turned off, the electric charge in the capacitor C4 is released through the resistor R4. The input voltage to the CMOS Schmitt inverter SI4 rises mildly. This charging and discharging process is repeated. When the input voltage to the CMOS Schmitt inverter SI4 decreases below the second inversion potential (1.2 volts) of the CMOS Schmitt inverter SI4, the logical output value of the CMOS Schmitt inverter SI4 makes an inversion from 0 to 1. As a result, the CMOS inverter formed by the MOS transistors T42 and T43 is first set into operation. At the same time, the MOS transistor T45 is turned off. The logical output value of the CMOS Schmitt inverter SI4 that has once become "1" is not inverted until the potential at the terminal c of the capacitor C4 drops below the first inversion potential (1.8 volts). In this way, the logical output value of the CMOS Schmitt inverter SI4 is maintained at 1 as shown in FIG. 8D. The oscillation signal produced from the CMOS inverter IV0 is inverted by the CMOS inverter formed by the MOS transistors T42 and T43. As shown in FIG. 8E, it can produce a clock signal with a duty cycle of 50%. This inverted output (clock signal) sets the circuit LA at the later stage into operation.

As described thus far, the present embodiment yields the same effect as the first embodiment by the same operation as the first embodiment. That is, a stable clock signal can be delivered to the circuit at the later stage even if the steady-state amplitude of the oscillation signal is small.

In the present embodiment, the MOS transistor T45 is made of a P-channel MOS transistor. It may also be made of an N-channel MOS transistor by using a logical value opposite to the logical output value of the CMOS Schmitt inverter SI4.

An oscillation control circuit in accordance with the present invention compares the charging voltage for a capacitor that is charged and discharged according to an oscillation signal with two threshold values for a Schmitt trigger, using this Schmitt trigger having given hysteresis characteristics. A decision is made as to whether the oscillation signal has made a transition from a minute amplitude to steady-state amplitude. The oscillator control circuit produces a clock signal to a circuit at a later stage to set the circuit at the later stage into operation. When the output of the Schmitt trigger assumes a first logical output value at which the clock signal is to be delivered to the circuit at the later stage, unstable operation (e.g., the clock signal to the circuit at the later stage is interrupted due to minute variations in the charging voltage for the capacitor) is suppressed. Therefore, if the oscillator circuit operates at high frequencies and at a low power-supply voltage (i.e., the steady-state amplitude of the oscillation signal is small, it takes a long time to make a transition from a minute amplitude to the steady-state amplitude, and the charging voltage for the capacitor stays for a long time near a given value for judgment of the transition), it is possible to stably deliver the clock signal to the circuit at the later stage.

Therefore, even the oscillator circuit operating at high frequencies and at a low power-supply voltage can prevent the oscillation operation from being hindered by the effects of noise and so on from the circuit at a later stage on the oscillating portion, by stopping the operation of the circuit at the later stage until a transition is made from minute amplitude at the initial phase of oscillation to steady-state amplitude. Consequently, the startability can be improved.

What is claimed is:

1. An oscillation control circuit comprising:
   a pair of power lines;
   an oscillator circuit having a first CMOS inverter and a piezoelectric oscillator connected between output and input terminals of said first CMOS inverter;
   a second CMOS inverter connected to said first CMOS inverter in series for receiving an oscillation signal produced from said first CMOS inverter;
   a control MOS transistor connected between a source of at least one of N- and P-channel transistors forming said second CMOS inverter and at least one of said power lines;
   an operation control circuit for maintaining said control MOS transistor in cutoff until an oscillation amplitude of the oscillation signal exceeds a given value; and
   said operation control circuit having a capacitor and a Schmitt trigger having input/output characteristics having a given hysteresis, said capacitor being charged and discharged according to said oscillation signal, said Schmitt trigger controlling said control MOS transistor according to a charging voltage for said capacitor.

2. An oscillation control circuit comprising:
   a pair of power lines;
   an oscillator circuit having a first CMOS inverter and a piezoelectric oscillator connected between output and input terminals of said first CMOS inverter;
   a second CMOS inverter connect to said first CMOS inverter in series for receiving an oscillation signal produced from said first CMOS inverter;
   a control MOS transistor connected between a source of at least one of N- and P-channel transistors forming said second CMOS inverter and at least one of said power lines;

an operation control circuit for maintaining said control MOS transistor in cutoff until an oscillation amplitude of the oscillation signal exceeds a given value;

an output control circuit for shorting out the output from said second CMOS inverter to one of said power lines when said control MOS transistor is in cutoff; and said operation control circuit having a capacitor and a Schmitt trigger having input/output characteristics having a given hysteresis, said capacitor being charged and discharged according to the oscillation amplitude of said oscillation signal, said Schmitt trigger controlling said control MOS transistor according to a charging voltage for said capacitor.

3. The oscillation control circuit of claim 1 or 2, wherein (A) said operation control circuit charges said capacitor during a period in which the oscillation potential of said oscillation signal is lower than a first reference potential that is lower than the inversion potential of said first CMOS inverter or is higher than a second reference potential that is higher than the inversion potential of said first CMOS inverter and discharges said capacitor during the remaining period, (B) said Schmitt trigger produces a first logical output value as its output when said charging voltage increases above a first threshold value and produces a second logical output value as its output when said charging voltage decreases below a second threshold value that is lower than the first threshold value, and (C) the first logical output value of the output from said Schmitt trigger turns on said control MOS transistor.

4. The oscillation control circuit of claim 1 or 2, wherein (A) said operation control circuit discharges said capacitor during a period in which the oscillation potential of said oscillation signal is lower than a first reference potential that is lower than the inversion potential of said first CMOS inverter or is higher than a second reference potential that is higher than the inversion potential of said first CMOS inverter and charges said capacitor during the remaining period, (B) said Schmitt trigger produces a first logical output value as its output when said charging voltage drops below a first threshold value and produces a second logical output value as its output when said charging voltage increases beyond a second threshold value that is higher than said first threshold value, and (C) said first logical output value of the output from said Schmitt trigger turns on said control MOS transistor.

* * * * *